United States Patent [19]

Farah-Bakhsh et al.

[11] Patent Number: 4,958,088
[45] Date of Patent: Sep. 18, 1990

[54] LOW POWER THREE-STAGE CMOS INPUT BUFFER WITH CONTROLLED SWITCHING

[75] Inventors: Mohammad H. Farah-Bakhsh; Stephen L. Casper, both of Boise, Id.

[73] Assignee: Micron Technology, Inc., Boise, Id.

[21] Appl. No.: 368,405

[22] Filed: Jun. 19, 1989

[51] Int. Cl.[5] ............................................ H03K 17/687
[52] U.S. Cl. ................................... 307/443; 307/451; 307/279; 307/290
[58] Field of Search ............... 307/443, 451, 475, 360, 307/516, 579, 584–585, 290, 279

[56] References Cited

U.S. PATENT DOCUMENTS

| | | | |
|---|---|---|---|
| 4,295,062 | 10/1981 | Mihalich et al. | 307/290 X |
| 4,379,974 | 4/1983 | Plachno | 307/290 X |
| 4,461,963 | 7/1984 | Koomen | 307/279 |
| 4,506,168 | 3/1985 | Uya | 307/290 |
| 4,563,594 | 1/1986 | Koyama | 307/290 |
| 4,563,595 | 1/1986 | Bose | 307/290 |
| 4,687,955 | 8/1987 | Koinuma | 307/290 |
| 4,734,592 | 3/1988 | Essig et al. | 307/443 X |
| 4,818,901 | 4/1989 | Young et al. | 307/443 X |

FOREIGN PATENT DOCUMENTS

| | | | |
|---|---|---|---|
| 0283915 | 9/1988 | European Pat. Off. | 307/290 |
| 0132414 | 7/1985 | Japan | 307/290 |

*Primary Examiner*—David Hudspeth
*Attorney, Agent, or Firm*—Jon Paul Busack; Stan Protigal; Angus C. Fox

[57] ABSTRACT

A CMOS low power Schmitt type input buffer for a dynamic random access memory (DRAM) circuit. This buffer is further characterized in that a falling edge on the input has better than average noise immunity and has a slightly longer propagation time through the buffer than a rising edge.

6 Claims, 3 Drawing Sheets

LOW POWER THREE-STAGE CMOS INPUT BUFFER WITH CONTROLLED SWITCHING

FIELD OF THE INVENTION

This invention relates to a CMOS electronic circuit such as a dynamic random access memory (DRAM), specifically to low power internal buffering of the DRAM inputs.

BACKGROUND OF THE INVENTION

Integrated circuits such as DRAMs are often placed in electronic systems that are less than ideal from an electrical noise standpoint. Noise on the DRAM inputs can cause internal misfiring and malfunction of the circuit. General practice is to assume that systems will always be noisy, and that the DRAM input should be modified to operate properly in spite of the noise.

Negative transitions on some DRAM input signals (such as an address strobe, for example) are critical, since a mistriggered strobe can begin an accidental access cycle within the DRAM, possibly altering stored data.

A well known method to reduce DRAM noise sensitivity is to run an input through a Schmitt type input buffer internal to the chip.

SUMMARY OF THE INVENTION

A preferred embodiment of the invention is a CMOS Schmitt type input buffer that has low power requirements. This buffer is characterized in that a falling edge on the input has better than average noise immunity and has a slightly longer propagation time through the buffer than a rising edge.

DETAILED DESCRIPTION OF THE PREFERRED EMBODIMENT

Figure 1:
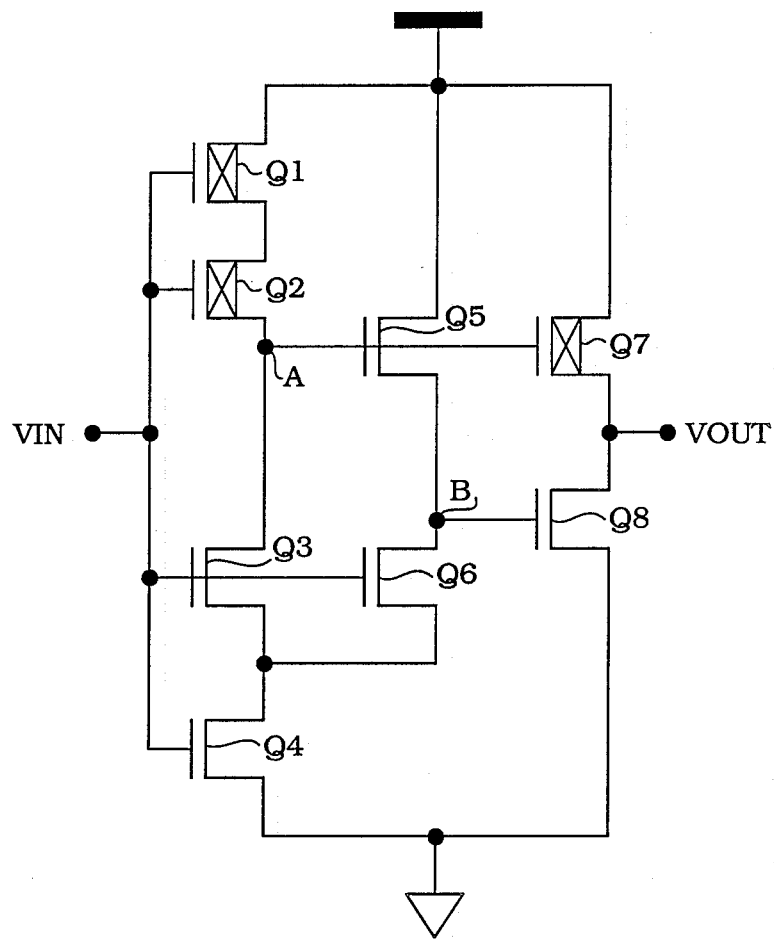
FIG. 1 is a schematic of the inventive buffer.

A preferred embodiment of the invention includes input stage transistors Q1, Q2, Q3, and Q4, middle stage transistors Q5 and Q6, and output stage transistors Q7 and Q8, all connected as shown in FIG. 1. Q1, Q2, and Q7 are p-channel devices, and the rest are n-channel devices. VIN is an input terminal, and VOUT is an output terminal. Q1 and Q2 together have just enough gain to gate Q5 and Q7. Q5 has just enough gain to gate Q8. These low gains contribute to the low power requirement of the inventive buffer. Q7 and Q8 are sized sufficiently to drive a desired load on VOUT.

Figure 2:
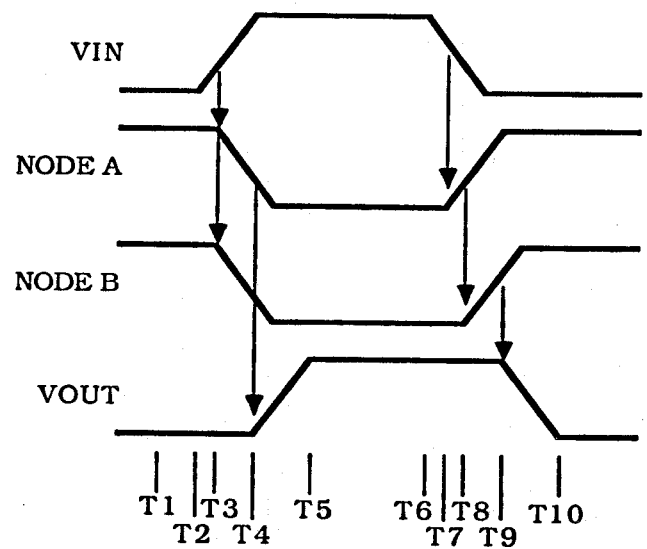
FIG. 2 is a timing diagram showing the operation of the buffer.

The operation of the preferred embodiment is now described with reference to FIG. 2, where waveforms of nodes VIN, A, B, and VOUT are shown (not to scale) over an operation cycle.

At time T1, VIN is driven low and the embodiment is at equilibrium. Nodes A and B are both high. At time T2, VIN begins a positive transition, simultaneously deactivating Q1 and Q2 and activating Q3 and Q4. Q4 and Q6 overcome weak pullup Q5, and nodes A and B together begin a negative transition.

At time T4, A and B activate Q7 and Q8, and VOUT undergoes a positive transition until equilibrium at time T5.

At time T6, a negative transition begins on VIN, activating Q1 and Q2 and deactivating Q3, Q4, and Q6. At time T7, Q1 and Q2 begin pulling up node A, activating Q5, which begins pulling up node B at time T8. Also, approximately at time T8, node A deactivates Q7, allowing VOUT to begin to fall as shown. At time T9, node B activates Q8, which begins to pull VOUT down. At time T10, VOUT is fully pulled down and equilibrium is reached as at time T1.

It should be noted that for a positive transition at VIN, output stage transistors Q7 and Q8 behave just like an ordinary CMOS buffer stage: Q7 turns on while Q8 turns off, Q7 and Q8 both being on for an instant during the transition. However, for a negative transition, Q7 is allowed to fully turn off before Q8 is activated. This reduces power consumption of the buffer and gives a cleaner negative transition on VOUT, but propagation time is increased due to the T7-T8 delay on node B.

Figure 3:
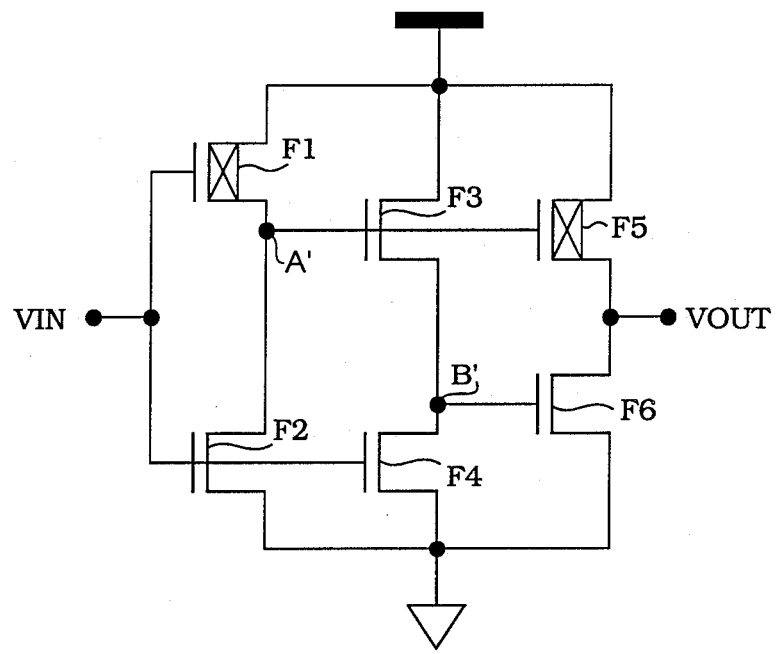
FIG. 3 shows an alternative embodiment of the invention.

An alternative embodiment is shown in FIG. 3, where transistor F1 is equivalent to Q1 and Q2, and F2 and F4 are equivalent to Q3, Q4, and Q6. In the preferred embodiment, one of the advantages of multiple transistors such as Q1 and Q2 is that adjustments can be made in the integrated circuit by metal optioning one of them in or out to adjust gain.

The same reasoning applies to Q4, with the added benefit that a change in Q4 affects Q3 and Q6 identically.

Although these embodiments are intended for use in a DRAM, this inventive buffer is ideal for any low power application where a noise immune negative transition is desired and where slightly slower propagation of such a transition is not a hindrance.

What is claimed is:

1. A buffer, comprising:
   (a) an output;
   (b) an output stage which includes a pulldown device and a pullup device coupled to the output, wherein the pullup device is deactivated before said pulldown device is activated;
   (c) an input stage, comprising a first transistor of a first conductivity type, and a second transistor of a second conductivity type, said transistors gated by an input node, a first terminal of said first transistor responsive to a supply potential, a second terminal of said first transistor and a first terminal of said second transistor connected to a first node, a second terminal of said second transistor responsive to a reference potential;
   (d) a middle stage, comprising third and fourth transistors of said second conductivity type, said third transistor gated by said first node, said fourth transistor gated by said input node, a first terminal of said third transistor responsive to said supply potential, a second terminal of said third transistor and a first terminal of said fourth transistor connected to a second node, a second terminal of said fourth transistor responsive to said reference potential; and
   (e) said output stage comprising a fifth transistor of said first conductivity type and a sixth transistor of said second conductivity type, said fifth transistor gated by said first node, said sixth transistor gated by said second node, a first terminal of said fifth transistor responsive to said supply potential, a second terminal of said fifth transistor and a first terminal of said sixth transistor connected to an output node, a second terminal of said sixth transistor responsive to said reference potential.

2. The buffer of claim 1, wherein said first transistor is minimally sized to gate said third and fifth transistors, and wherein said third transistor is minimally sized to gate said sixth transistor, thereby reducing power requirements of the buffer.

3. The buffer of claim 1, wherein said first conductivity type is p and said second conductivity type is n.

4. A buffer comprising:
(a) an output;
(b) an output stage which includes a pulldown device and a pullup device coupled to the output, wherein the pullup device is deactivated before said pulldown device is activated;
(c) an input stage, comprising first and second transistors of a first conductivity type, and third and fourth transistors of a second conductivity type, said transistors gated by an input node, a first terminal of said first transistor connected to a supply potential, a second terminal of said first transistor and a first terminal of said second transistor connected to a first node, a second terminal of said second transistor and a first terminal of said third transistor connected to a second node, a second terminal of said third transistor and a first terminal of said fourth transistor connected to a third node, a second terminal of said fourth transistor connected to a reference potential;
(d) a middle stage, comprising fifth and sixth transistors of said second conductivity type, said fifth transistor gated by said second node, said sixth transistor gated by said input node, a first terminal of said fifth transistor connected to said supply potential, a second terminal of said fifth transistor and a first terminal of said sixth transistor connected to a fourth node, a second terminal of said sixth transistor responsive to said third node; and
(e) said output stage comprising a seventh transistor of said first conductivity type and an eighth transistor of said second conductivity type, said seventh transistor gated by said second node, said eighth transistor gated by said fourth node, a first terminal of said seventh transistor connected to said supply potential, a second terminal of said seventh transistor and a first terminal of said eighth transistor connected to an output node, a second terminal of said eighth transistor connected to said reference potential.

5. The buffer of claim 4, wherein said first and second transistors are minimally sized to gate said fifth and seventh transistors, and wherein said fifth transistor is minimally sized to gate said eighth transistor, thereby reducing power requirements of the buffer.

6. The buffer of claim 4, wherein said first conductivity type is p and said second conductivity type is n.

* * * * *